(12) United States Patent
Choi et al.

(10) Patent No.: US 11,088,232 B2
(45) Date of Patent: *Aug. 10, 2021

(54) DISPLAY DEVICE

(71) Applicant: SAMSUNG DISPLAY CO., LTD., Yongin-si (KR)

(72) Inventors: Wonsuk Choi, Yongin-si (KR); Seongryong Lee, Yongin-si (KR); Yonghwan Park, Yongin-si (KR); Nayun Kwak, Yongin-si (KR); Hwajeong Kim, Yongin-si (KR); Eunae Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/522,827

(22) Filed: Jul. 26, 2019

(65) Prior Publication Data
US 2020/0083306 A1 Mar. 12, 2020

(30) Foreign Application Priority Data
Sep. 6, 2018 (KR) .................. 10-2018-0106749

(51) Int. Cl.
*H01L 27/32* (2006.01)
*H01L 51/52* (2006.01)

(52) U.S. Cl.
CPC ........ *H01L 27/3258* (2013.01); *H01L 27/326* (2013.01); *H01L 51/5237* (2013.01); *H01L 51/5221* (2013.01); *H01L 2227/32* (2013.01)

(58) Field of Classification Search
CPC .............. H01L 27/3297; H01L 51/525; H01L 27/3246; H01L 27/3276; H01L 51/5253
See application file for complete search history.

(56) References Cited

U.S. PATENT DOCUMENTS

| 8,829,495 | B2 | 9/2014 | Kim et al. |
| 9,153,631 | B2 | 10/2015 | Sung et al. |
| 9,391,296 | B2 | 7/2016 | Park et al. |

(Continued)

FOREIGN PATENT DOCUMENTS

| KR | 1020150001012 A | 1/2015 |
| KR | 1020150025994 A | 3/2015 |

(Continued)

*Primary Examiner* — Fernando L Toledo
*Assistant Examiner* — Valerie N Newton
(74) *Attorney, Agent, or Firm* — Cantor Colburn LLP

(57) ABSTRACT

A display device includes a substrate, a display area located over the substrate and including a plurality of pixels, a non-display area arranged outside the display area, a first power voltage line corresponding to one side of the display area in the non-display area and including a first conductive layer and a second conductive layer arranged over the first conductive layer, a second power voltage line spaced apart from the first power voltage line in the non-display area, a first dam unit surrounding the display area and overlapping the second power voltage line in a plan view, a second dam unit arranged outside the first dam unit, and a third dam unit arranged between the display area and the first dam unit and overlapping the first conductive layer and the second conductive layer of the first power voltage line in the plan view.

24 Claims, 7 Drawing Sheets

(56) References Cited

U.S. PATENT DOCUMENTS

| | | | |
|---|---|---|---|
| 9,412,972 B2 | 8/2016 | Shim et al. | |
| 9,685,626 B2 | 6/2017 | Kim | |
| 9,859,334 B2 | 1/2018 | Kim et al. | |
| 10,777,771 B2 * | 9/2020 | Lee | H01L 27/3276 |
| 2018/0033830 A1 | 2/2018 | Kim et al. | |

FOREIGN PATENT DOCUMENTS

| | | |
|---|---|---|
| KR | 1020160032800 A | 3/2016 |
| KR | 101701978 B1 | 1/2017 |
| KR | 1020170134903 A | 12/2017 |
| KR | 1020180014398 A | 2/2018 |

* cited by examiner

DISPLAY DEVICE

CROSS-REFERENCE TO RELATED APPLICATION

This application claims priority to Korean Patent Application No. 10-2018-0106749, filed on Sep. 6, 2018, and all the benefits accruing therefrom under 35 U.S.C. § 119, the content of which in its entirety is herein incorporated by reference.

BACKGROUND

1. Field

One or more exemplary embodiments relate to a display device, and more particularly, to a display device that implements high quality while reducing an area of a dead space of the display device.

2. Description of the Related Art

A display device is a device that visually displays data. Recently, the purposes of a display device have become more diversified. Also, as a display device is thin and lightweight, a range of use thereof has gradually been extended.

The display device includes a substrate divided into a display area and a non-display area outside the display area. The non-display area in which non-display elements such as a pad unit, a plurality of wirings, and a driving circuit unit are arranged is a dead space which does not implement an image. Recently, the demand for reducing the dead space of a display device has increased.

SUMMARY

One or more exemplary embodiments include a display device and a manufacturing method thereof that reduce a dead space and provide a high-quality image. However, it should be understood that exemplary embodiments described herein should be considered in a descriptive sense only and not for limitation of the disclosure.

Additional aspects will be set forth in part in the description which follows and, in part, will be apparent from the description, or may be learned by practice of the presented exemplary embodiments.

According to one or more exemplary embodiments, a display device includes a substrate; a display area located over the substrate and which includes a plurality of pixels, a non-display area arranged outside the display area, a first power voltage line which corresponds to one side of the display area in the non-display area and includes a first conductive layer and a second conductive layer arranged over the first conductive layer, a second power voltage line spaced apart from the first power voltage line in the non-display area, a first dam unit which surrounds the display area and overlaps the second power voltage line in a plan view, a second dam unit arranged outside the first dam unit, and a third dam unit arranged between the display area and the first dam unit and which overlaps the first conductive layer and the second conductive layer of the first power voltage line in a plan view.

In an exemplary embodiment, the display device may further include a first planarization layer arranged in the display area and the non-display area, a second planarization layer arranged over the first planarization layer, and a pixel-defining layer arranged over the second planarization layer, where the third dam unit may include at least one of the pixel-defining layer and the second planarization layer.

In an exemplary embodiment, a step difference may be provided in a top surface of an upper layer among the pixel-defining layer and the second planarization layer.

In an exemplary embodiment, a bottom layer among the pixel-defining layer and the second planarization layer may clad an end of the second conductive layer.

In an exemplary embodiment, the upper layer among the pixel-defining layer and the second planarization layer may clad an end of the bottom layer.

In an exemplary embodiment, each of the pixels may include a first electrode, an emission layer arranged on the first electrode, and a second electrode arranged on the emission layer, and the second electrode may be arranged in common in the plurality of pixels and may extend to the non-display area to cover a portion of the third dam unit.

In an exemplary embodiment, the display device may further include a thin-film encapsulation layer which includes a first inorganic encapsulation layer that covers the display area, an organic encapsulation layer on the first inorganic encapsulation layer, and a second inorganic encapsulation layer on the organic encapsulation layer, and the thin-film encapsulation layer may cover the third dam unit.

In an exemplary embodiment, the first inorganic encapsulation layer may directly contact the second inorganic encapsulation layer at the outside of the second dam unit.

In an exemplary embodiment, a width of the second conductive layer may be less than a width of the first conductive layer.

In an exemplary embodiment, the second conductive layer may be provided in plural and the second conductive layers may be spaced apart from each other over the first conductive layer, and the third dam unit may clad, with an insulating layer, each of the plurality of second conductive layers spaced apart from each other to constitute a plurality of sub-dam units.

In an exemplary embodiment, an insulating layer may be arranged between the first conductive layer and the second conductive layer, and the first conductive layer may be electrically connected with the second conductive layer through a contact hole defined by the insulating layer.

In an exemplary embodiment, the second power voltage line may include a third conductive layer and a fourth conductive layer arranged on the third conductive layer.

In an exemplary embodiment, an insulating layer may be arranged between the third conductive layer and the fourth conductive layer, and the third conductive layer may be electrically connected with the fourth conductive layer through a contact hole defined by the insulating layer.

In an exemplary embodiment, the first dam unit or the second dam unit may clad an end of the fourth conductive layer.

In an exemplary embodiment, the third conductive layer may include a same material as the first conductive layer, and the fourth conductive layer may include a same material as the second conductive layer.

In an exemplary embodiment, a width of the fourth conductive layer may be greater than a width of the second conductive layer.

In an exemplary embodiment, a plurality of wirings spaced apart from each other may be disposed between the substrate and the first conductive layer and between the substrate and the third conductive layer in a direction that crosses the first conductive layer and the third conductive layer.

In an exemplary embodiment, the display device may further include a first planarization layer arranged in the display area and the non-display area, a second planarization layer arranged over the first planarization layer and a pixel-defining layer arranged over the second planarization layer, where the first dam unit and the second dam unit may include at least one of the first planarization layer and the second planarization layer.

In an exemplary embodiment, a height of the second dam unit may be greater than a height of the first dam unit.

According to one or more exemplary embodiments, a display device includes a display area including a plurality of display elements, a non-display area arranged outside the display area, a terminal unit arranged at an end of the non-display area, a first power voltage line arranged between the display area and the terminal unit and which includes a first conductive layer and a second conductive layer arranged on the first conductive layer, a second power voltage line spaced apart from the first power voltage line and which includes a third conductive layer and a fourth conductive layer arranged on the third conductive layer, a first dam unit which overlaps the second power voltage line in a plan view, a second dam unit arranged outside the first dam unit, a third dam unit arranged between the display area and the first dam unit and which overlaps the first conductive layer and the second conductive layer of the first power voltage line in the plan view, and a thin-film encapsulation layer which includes a first inorganic encapsulation layer covering the display area and the third dam unit, an organic encapsulation layer on the first inorganic encapsulation layer, and a second inorganic encapsulation layer on the organic encapsulation layer.

In an exemplary embodiment, the display device may further include a first planarization layer arranged in the display area and the non-display area, a second planarization layer arranged over the first planarization layer and a pixel-defining layer arranged over the second planarization layer, where the third dam unit may include at least one of the pixel-defining layer and the second planarization layer.

In an exemplary embodiment, a plurality of wirings spaced apart from each other may be disposed between the substrate and the first conductive layer and between the substrate and the third conductive layer in a direction that faces the terminal unit.

In an exemplary embodiment, the third conductive layer may include a same material as the first conductive layer, and the fourth conductive layer may include a same material as the second conductive layer.

In an exemplary embodiment, the display device may further include a thin film transistor, and the first to third dam units may include an insulating layer pattern including a same material as an insulating layer arranged between the thin film transistor and the display element.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
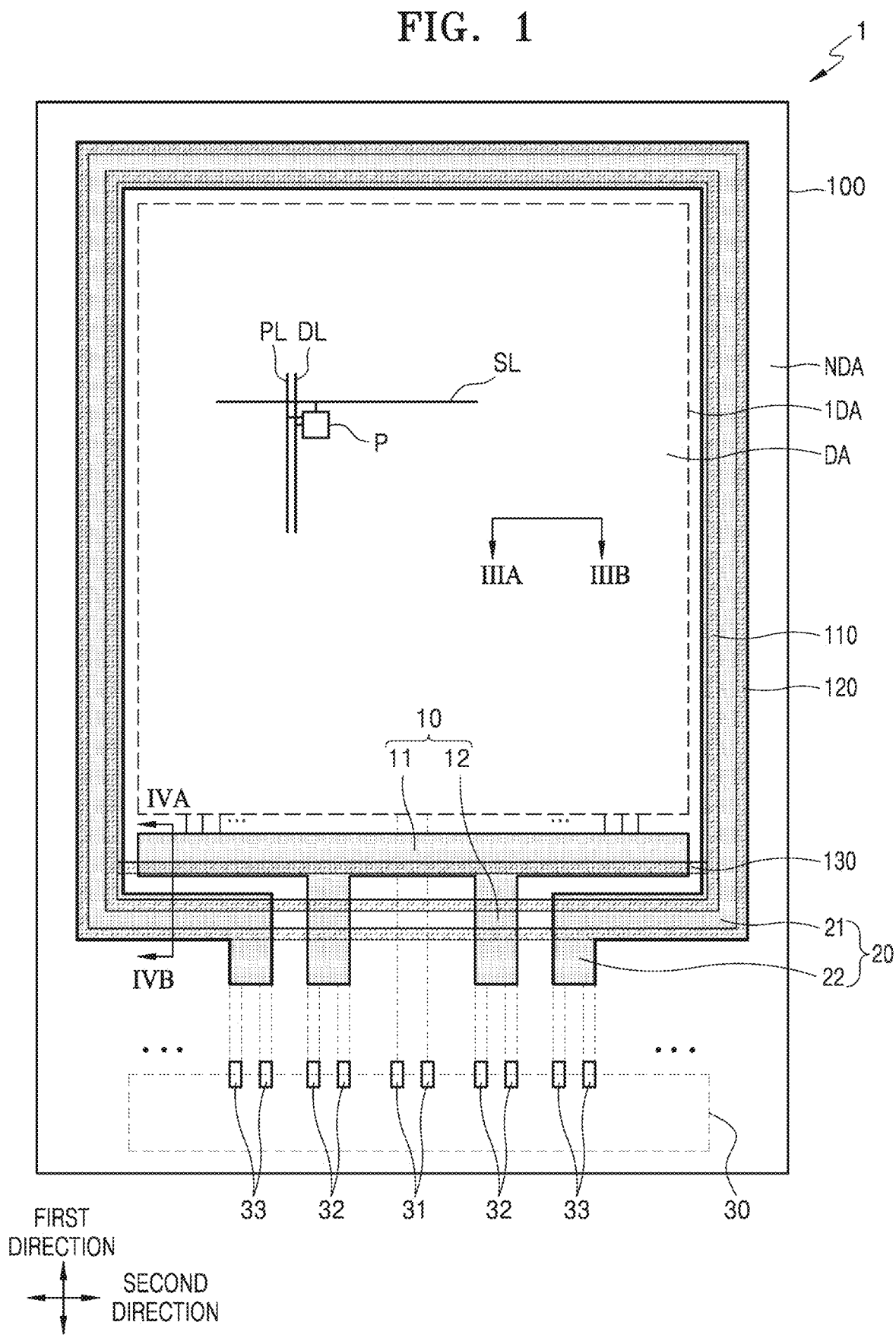
FIG. 1 is a plan view of a display device according to an exemplary embodiment.

As the disclosure allows for various changes and numerous exemplary embodiments, example embodiments will be illustrated in the drawings and described in detail in the written description. An effect and a characteristic of the disclosure, and a method of accomplishing these will be apparent when referring to exemplary embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When a description is made with reference to the drawings, like reference numerals in the drawings denote like or corresponding elements, and repeated description thereof will be omitted.

As used herein, the term "and/or" includes any and all combinations of one or more of the associated listed items.

Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "on" or "over" another layer, region, or component, it can be directly or indirectly disposed on or over the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

A display device is a device that displays an image and may be a liquid crystal display, an electrophoretic display, an organic light-emitting display, an inorganic light-emitting display, a field emission display, a surface-conduction electron-emitter display, a plasma display, a cathode ray display, etc.

Hereinafter, though an organic light-emitting display device is exemplarily described as the display device according to an exemplary embodiment, the display device is not limited thereto and the display device may be various other display devices.

Figure 2A:
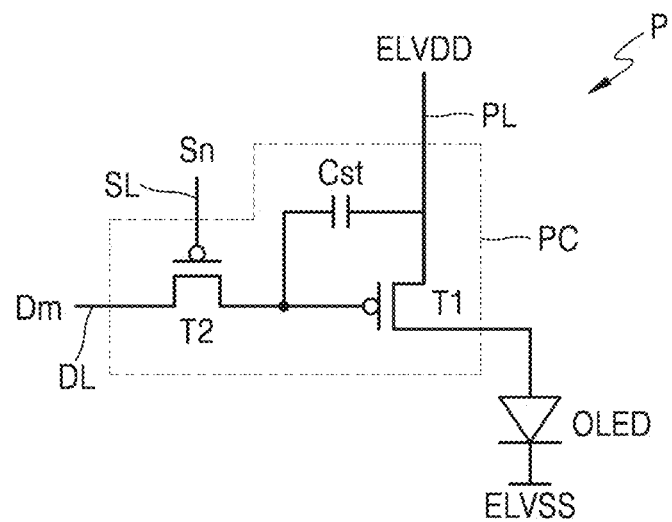
FIGS. 2A and 2B are equivalent circuit diagrams of one of the pixels included in a display device according to an exemplary embodiment.
Figure 2B:
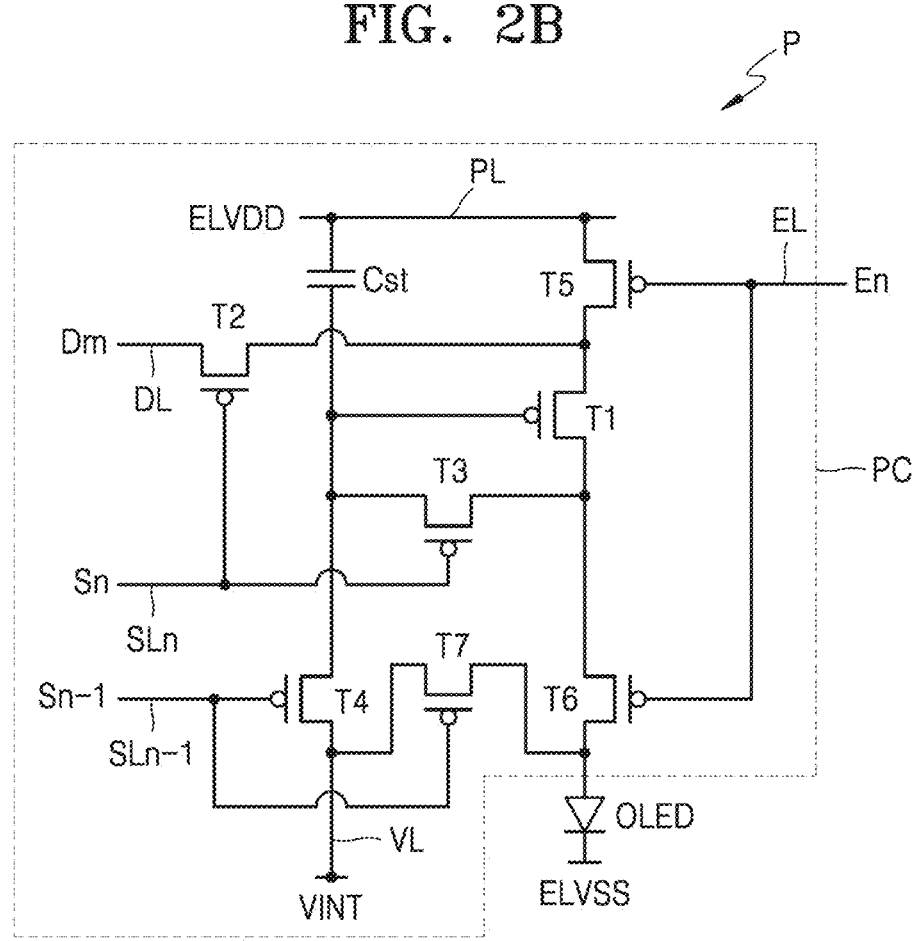
Figure 3:
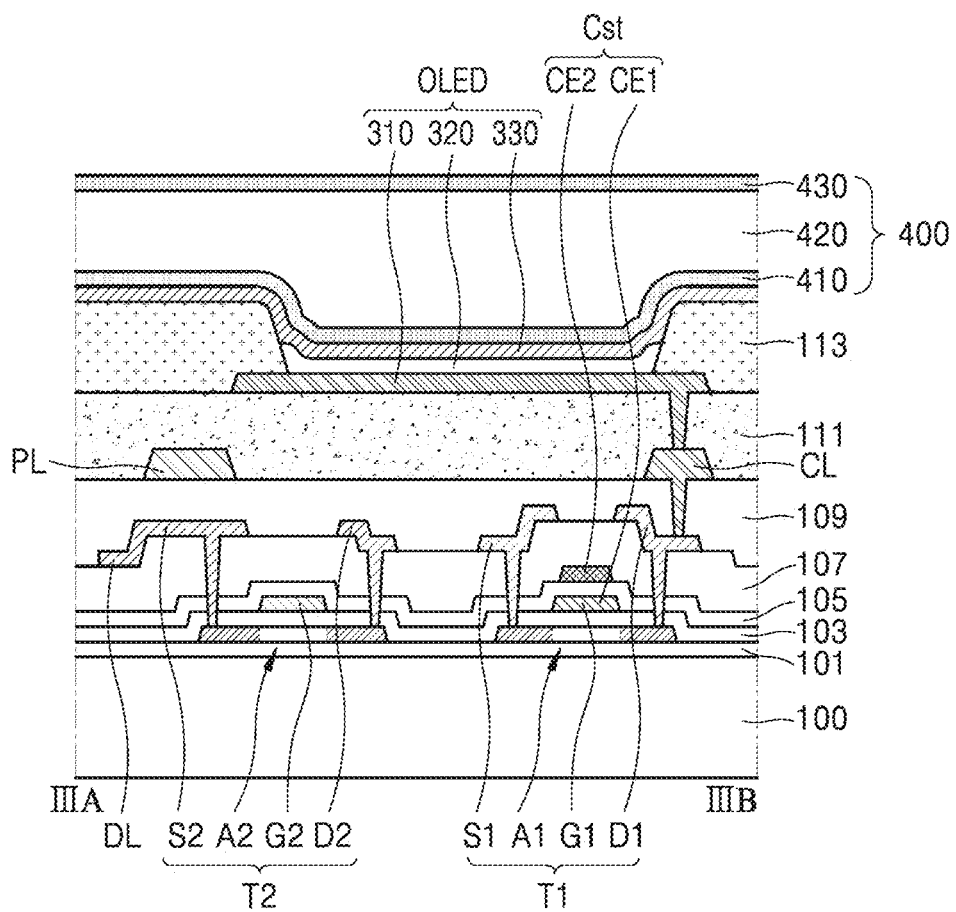
FIG. 3 is a cross-sectional view of one of the pixels included in a display device, taken along line IIIA-IIIB of FIG. 1, according to an exemplary embodiment.
Figure 4:
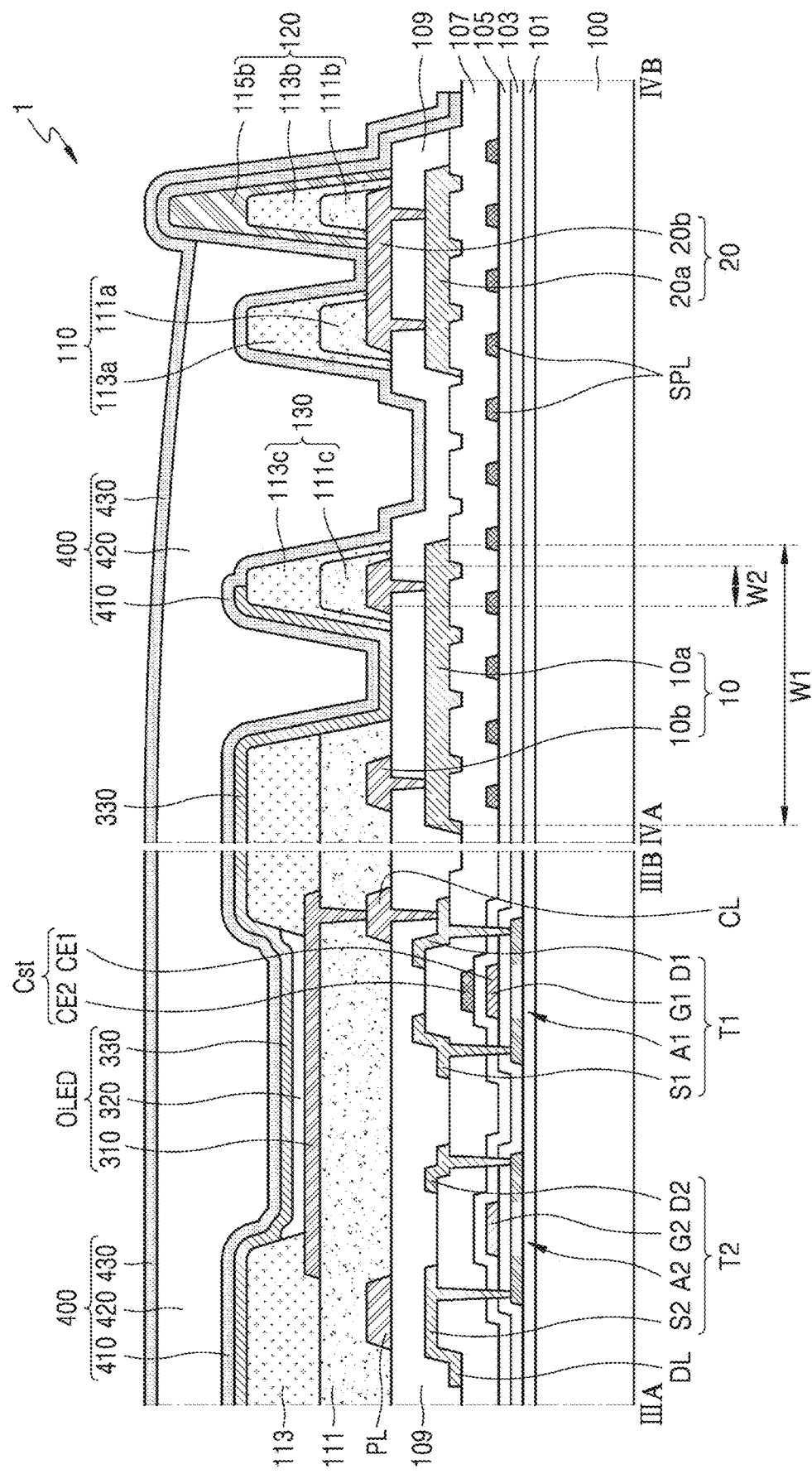
FIG. 4 is a cross-sectional view of one of the pixels taken along lines IIIA-IIIB and IVA-IVB of FIG. 1.

FIG. 1 is a plan view of a display device 1 according to an exemplary embodiment, FIGS. 2A and 2B are equivalent circuit diagrams of one of the pixels included in a display device according to an exemplary embodiment, FIG. 3 is a cross-sectional view of one of the pixels included in the display device 1, taken along line IIIA-IIIB of FIG. 1, according to an exemplary embodiment, and FIG. 4 is a cross-sectional view of one of the pixels taken along lines IIIA-IIIB and IVA-IVB of FIG. 1.

Referring to FIG. 1, the display device 1 includes a display unit 1DA arranged on a substrate 100. The display unit 1DA includes pixels P connected to a data line DL that extends in a first direction and a scan line SL that extends in a second direction crossing the first direction. Each pixel P may be connected with a driving voltage line PL that extends in the first direction.

One pixel P may emit, for example, red, green, blue, or white light and may include, for example, an organic light-emitting diode ("OLED"). Also, each pixel P may further include an element such as a thin film transistor and a capacitor.

The display unit 1DA provides a predetermined image by using light emitted from the pixels P and defines a display area DA. A non-display area NDA is arranged outside the display area DA. For example, the non-display area NDA may surround the display area DA.

The non-display area NDA is an area in which pixels are not arranged and thus does not provide an image. A first power voltage line 10 and a second power voltage line 20, which different voltages, may be arranged in the non-display area NDA.

The first power voltage line 10 may include a first main voltage line 11 and a first connection line 12. Each of the first main voltage line 11 and the first connection line 12 is arranged on one side of the display area DA. For example, in the case where the display area DA has a rectangular shape, the first main voltage line 11 may be arranged to correspond to one of the sides of the display area DA. The first connection line 12 extends from the first main voltage line 11 in a first direction. Here, the first direction may be understood as a direction from the display area DA to a terminal unit 30 located near an edge of the substrate 100. The first connection line 12 may be connected with a first terminal 32 of the terminal unit 30.

The second power voltage line 20 may include a second main voltage line 21 that surrounds two opposite ends of the first main voltage line 11 and portions of the display area DA, and a second connection line 22 that extends from the second main voltage line 21 in the first direction. For example, in the case where the display area DA has a rectangular shape, the second main voltage line 21 may extend along two opposite ends of the first main voltage line 11 and the rest of the sides except the side of the display area DA that is adjacent to the first main voltage line 11. The second connection line 22 may extend in the first direction in parallel to the first connection line 12 and may be connected with a second terminal 33 of the terminal unit 30. The second power voltage line 20 may be bent to surround the opposite ends of the first main voltage line 11.

The terminal unit 30 is arranged at one end of the substrate 100 and includes a plurality of terminals 31, 32, and 33. The terminal unit 30 is not covered by an insulating layer and is exposed and thus may be electrically connected with a flexible printed circuit board or a controller (not shown) such as a driving driver IC chip.

The controller changes a plurality of image signals transferred from the outside to a plurality of image data signals and transfers the image data signals to the display area DA through the third terminal 31. Also, the controller may receive a vertical synchronization signal, a horizontal synchronization signal, and a clock signal, generate control signals to control driving of first and second gate drivers (not shown), and transfer the control signals to the first and second gate drivers, respectively, through a terminal (not shown).

The controller may transfer different voltages to the first power voltage line 10 and the second power voltage line 20 through the first terminal 32 and the second terminal 33, respectively.

The first power voltage line 10 may provide a first power voltage ELVDD (see FIGS. 2A and 2B) to each pixel P, and the second power voltage line 20 may provide a second power voltage ELVSS (see FIGS. 2A and 2B) to each pixel P.

For example, the first power voltage ELVDD (see FIGS. 2A and 2B) may be provided to each pixel P through the driving voltage line PL connected with the first power voltage line 10. The second power voltage ELVSS (see FIGS. 2A and 2B) is provided to a cathode of an organic light-emitting diode OLED (see FIGS. 2A and 2B) of each pixel P. In this case, the second main voltage line 21 of the second power voltage line 20 may be connected with the cathode of the organic light-emitting diode OLED (see FIGS. 2A and 2B) in the non-display area NDA.

Though not shown, a scan driver configured to provide a scan signal to a scan line SL of each pixel P, a data driver configured to provide a data signal to a data line DL, etc. may be arranged in the non-display area NDA.

A first dam unit 110 and a second dam unit 120 may be spaced apart from each other in the non-display area NDA. Each of the first dam unit 110 and the second dam unit 120 surrounds the display area DA.

The first dam unit 110 and the second dam unit 120 serve as dams configured to block flowing of an organic material into an edge of the substrate 100 while an organic encapsulation layer 420 (see FIGS. 3 and 4) including the organic material and constituting a thin-film encapsulation layer 400 (see FIGS. 3 and 4) is formed, and thus prevent an edge tail of the organic encapsulation layer 420 from being formed at the edge of the substrate 100.

The first dam unit 110 and the second dam unit 120 may overlap the second power voltage line 20 in the plan view. Therefore, heights of the first dam unit 110 and the second dam unit 120 may be raised by heights of a third conductive layer 20a (see FIG. 4) and a fourth conductive layer 20b (see FIG. 4) that constitute the second power voltage line 20.

A case where the organic encapsulation layer 420 flows to the edge of the substrate 100 beyond the first dam unit 110 and the second dam unit 120 despite the arrangement of the first dam unit 110 and the second dam unit 120 may occur. For example, in the case where the second dam unit 120 is arranged closer to the first dam unit 110 from the edge of the substrate 100 so as to reduce an area recognized as a dead space (i.e., area which does not implement an image) from a viewer of the outside, or the first dam unit 110 is arranged closer to the second dam unit 120 so as to increase the display area DA of the display unit 1DA, an interval between the first dam unit 110 and the second dam unit 120 may be reduced and thus the organic encapsulation layer 420 may flow beyond the second dam unit 120 to the edge of the substrate 100. The edge tail formed by the overflow of the organic material may serve as a transmission path of external impurities and thus may cause a defect of the organic light-emitting diode OLED.

In the present exemplary embodiment, since a third dam unit 130 is arranged between the display unit 1DA and the first dam unit 110 such that the third dam unit 130 overlaps the first power voltage line 10 in the plan view, a reflow velocity of the organic material may be reduced. Therefore, the edge tail of the organic material may be effectively prevented.

The third dam unit 130 may overlap the first power voltage line 10. Therefore, a height of the third dam unit 130 may be raised by heights of a first conductive layer 10a (see FIG. 4) and a second conductive layer 10b (see FIG. 4) that constitute the first power voltage line 10.

Referring to FIG. 2A, in an exemplary embodiment, each pixel P includes a pixel circuit PC connected to the scan line SL and the data line DL, and the organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm input through the data line DL to the driving thin film transistor T1 in response to a scan signal Sn input through the scan line SL.

The storage capacitor Cst is connected to the switching thin film transistor T2 and the driving voltage line PL and stores a voltage corresponding to a difference between a voltage transferred from the switching thin film transistor T2 and the first power voltage ELVDD (or a driving voltage) supplied to the driving voltage line PL.

The driving thin film transistor T1 is connected to the driving voltage line PL and the storage capacitor Cst and may control a driving current flowing through the organic light-emitting diode OLED from the driving voltage line PL in response to a voltage value stored in the storage capacitor Cst. The organic light-emitting diode OLED may emit light having predetermined brightness by using the driving current.

Though FIG. 2A shows the case where the pixel circuit PC includes two thin film transistors and one storage capacitor, the invention is not limited thereto.

Referring to FIG. 2B, in another exemplary embodiment, the pixel circuit PC may include the driving and switching thin film transistors T1 and T2, a compensation thin film transistor T3, a first initialization thin film transistor T4, a first emission control thin film transistor T5, a second emission control thin film transistor T6, and a second initialization thin film transistor T7.

Though FIG. 2B shows that each pixel P includes signal lines SLn, SLn-1, EL, and DL, an initialization voltage line VL, and a driving voltage line PL, the invention is not limited thereto. In another exemplary embodiment, at least one of the signal lines SLn, SLn-1, EL, and DL, and/or the initialization voltage line VL may be shared by adjacent pixels.

A drain electrode of the driving thin film transistor T1 may be electrically connected with the organic light-emitting diode OLED via the second emission control thin film transistor T6. The driving thin film transistor T1 receives a data signal Dm in response to a switching operation of the switching thin film transistor T2 and transfers the driving current to the organic light-emitting diode OLED.

A gate electrode of the switching thin film transistor T2 is connected with the first scan line SL, and a source electrode of the switching thin film transistor T2 is connected to the data line DL. A drain electrode of the switching thin film transistor T2 may be connected with a source electrode of the driving thin film transistor T1 and connected with the driving voltage line PL via the first emission control thin film transistor T5.

The switching thin film transistor T2 is turned on in response to a first scan signal Sn transferred through the first scan line SLn and performs a switching operation of transferring a data signal Dm transferred through the data line DL to the source electrode of the driving thin film transistor T1.

A gate electrode of the compensation thin film transistor T3 may be connected to the first scan line SLn. A source electrode of the compensation thin film transistor T3 may be connected with the drain electrode of the driving thin film transistor T1 and connected with a pixel electrode of the organic light-emitting diode OLED via the second emission control thin film transistor T6. A drain electrode of the compensation thin film transistor T3 may be connected with one of the electrodes of the storage capacitor Cst, a source electrode of the first initialization thin film transistor T4, and the gate electrode of the driving thin film transistor T1. The compensation thin film transistor T3 is turned on in response to the first scan signal Sn transferred through the first scan line SLn and diode-connects the driving thin film transistor T1 by connecting the gate electrode of the driving thin film transistor T1 with the drain electrode of the driving thin film transistor T1.

A gate electrode of the first initialization thin film transistor T4 may be connected with a second scan line SLn-1 (also referred to as a previous scan line). A drain electrode of the first initialization thin film transistor T4 may be connected with the initialization voltage line VL. The source electrode of the first initialization thin film transistor T4 may be connected with one of the electrodes of the storage capacitor Cst, the drain electrode of the compensation thin film transistor T3, and the gate electrode of the driving thin film transistor T1. The first initialization thin film transistor T4 is turned on in response to a second scan signal Sn-1 transferred through the second scan line SLn-1 and may perform an initialization operation of initializing a voltage of the gate electrode of the driving thin film transistor T1 by transferring an initialization voltage VINT to the gate electrode of the driving thin film transistor T1.

A gate electrode of the first emission control thin film transistor T5 may be connected with the emission control line EL. A source electrode of the first emission control thin film transistor T5 may be connected with the driving voltage line PL. A drain electrode of the first emission control thin film transistor T5 is connected to the source electrode of the driving thin film transistor T1 and the drain electrode of the switching thin film transistor T2.

A gate electrode of the second emission control thin film transistor T6 may be connected with the emission control line EL. A source electrode of the second emission control thin film transistor T6 may be connected with the drain electrode of the driving thin film transistor T1 and the source electrode of the compensation thin film transistor T3. A drain electrode of the second emission control thin film transistor T6 may be electrically connected with the pixel electrode of the organic light-emitting diode OLED. The first emission control thin film transistor T5 and the second emission control thin film transistor T6 are simultaneously turned on in response to an emission control signal En transferred through the emission control line EL, and the first power voltage ELVDD is transferred to the organic light-emitting diode OLED and thus the driving current flows through the organic light-emitting diode OLED.

A gate electrode of the second initialization thin film transistor T7 may be connected to the second scan line SLn-1. A source electrode of the second initialization thin film transistor T7 may be connected with the pixel electrode of the organic light-emitting diode OLED. A drain electrode of the second initialization thin film transistor T7 may be connected with the initialization voltage line VL. The second initialization thin film transistor T7 may be turned on in response to a second scan signal Sn-1 transferred through the second scan line SLn-1 to initialize the pixel electrode of the organic light-emitting diode OLED.

Though FIG. 2B shows the case where the first initialization thin film transistor T4 and the second initialization thin film transistor T7 are connected to the second scan line SLn-1, the invention is not limited thereto. In another exemplary embodiment, the first initialization thin film transistor T4 may be connected to the second scan line SLn-1 (e.g., a previous scan line), and driven in response to the second scan signal Sn-1, and the second initialization thin film transistor T7 may be connected to a separate signal line (e.g. the next scan line) and driven in response to a signal transferred through the relevant scan line.

The other electrode of the storage capacitor Cst may be connected with the driving voltage line PL. One of the electrodes of the storage capacitor Cst may be connected to the gate electrode of the driving thin film transistor T1, the drain electrode of the compensation thin film transistor T3, and the source electrode of the first initialization thin film transistor T4.

An opposite electrode (e.g. a cathode) of the organic light-emitting diode OLED receives the second power voltage ELVSS (or a common power voltage). The organic light-emitting diode OLED receives the driving current from the driving thin film transistor T1 and emits light.

The pixel circuit PC according to the invention is not limited to the number of thin film transistors and storage capacitors and the circuit design described with reference to FIGS. 2A and 2B. The number of thin film transistors and storage capacitors and the circuit design may be variously changed.

The first and second thin film transistors T1 and T2 and the storage capacitor Cst of the pixel circuit PC of each pixel P described with reference to FIGS. 2A and 2B are described in more detail with reference to FIG. 3.

Referring to FIG. 3, a buffer layer 101 is arranged on the substrate 100, and the driving thin film transistor T1, the switching thin film transistor T2, and the storage capacitor Cst are arranged over the buffer layer 101.

The substrate 100 may include various materials such as glass, metal, or plastic. In an exemplary embodiment, for example, the substrate 100 may include a flexible substrate including a polymer resin such as polyethersulphone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP").

In an exemplary embodiment, the buffer layer 101 including $SiO_x$ and/or $SiN_x$ configured to prevent impurities from penetrating may be provided on the substrate 100.

The driving thin film transistor T1 includes a driving semiconductor layer A1 and a driving gate electrode G1, and the switching thin film transistor T2 includes a switching semiconductor layer A2 and a switching gate electrode G2. A first gate insulating layer 103 is arranged between the driving semiconductor layer A1 and the driving gate electrode G1, and between the switching semiconductor layer A2 and the switching gate electrode G2. In an exemplary embodiment, the first gate insulating layer 103 may include an inorganic insulating material such as $SiO_x$, SiNx, and SiON.

In an exemplary embodiment, the driving semiconductor layer A1 or the switching semiconductor layer A2 may include amorphous silicon or polycrystalline silicon. In another exemplary embodiment, the driving semiconductor layer A1 or the switching semiconductor layer A2 may include an oxide including at least one of In, Ga, Sn, Zr, V, Hf, Cd, Ge, Cr, Ti, and Zn.

The driving semiconductor layer A1 includes a driving channel region overlapping the driving gate electrode G1 and not doped with impurities, and a driving source region and a driving drain region respectively doped with impurities in two opposite sides of the driving channel region. A driving source electrode S1 and a driving drain electrode D1 may be respectively connected to the driving source region and the driving drain region of the driving semiconductor layer A1.

The switching semiconductor layer A2 may include a switching channel region overlapping the switching gate electrode G2 and not doped with impurities, and a switching source region and a switching drain region respectively doped with impurities in two opposite sides of the switching channel region. A switching source electrode S2 and a switching drain electrode D2 may be respectively connected to the switching source region and the switching drain region of the switching semiconductor layer A2.

In an exemplary embodiment, the driving gate electrode G1 or the switching gate electrode G2 may include one of Mo, Al, Cu, and Ti and include a single layer or a multilayer.

In an exemplary embodiment, the storage capacitor Cst may overlap the driving thin film transistor T1 in the plan view. In this case, areas of the storage capacitor Cst and the driving thin film transistor T1 may increase and a high-quality image may be provided. For example, the driving gate electrode G1 may serve as a first storage capacitor plate CE1 of the storage capacitor Cst. A second storage capacitor plate CE2 may overlap the first storage capacitor plate CE1 with a second gate insulating layer 105 therebetween. In an exemplary embodiment, the second gate insulating layer 105 may include an inorganic insulating material such as $SiO_x$, $SiN_x$, and SiON.

The driving thin film transistor T1, the switching thin film transistor T2, and the storage capacitor Cst may be covered by an interlayer insulating layer 107.

In an exemplary embodiment, the interlayer insulating layer 107 may include an inorganic material layer including SiON, $SiO_x$ and/or $SiN_x$.

A data line DL may be arranged on the interlayer insulating layer 107 and may be connected with the switching semiconductor layer A2 of the switching thin film transistor T2 through a contact hole that passes through the interlayer insulating layer 107. The data line DL may serve as the switching source electrode S2.

The driving source electrode S1, the driving drain electrode D1, the switching source electrode S2, and the switching drain electrode D2 may be arranged on the interlayer insulating layer 107. Each of the switching source electrode S2 and the switching drain electrode D2 may be connected with the switching semiconductor layer A2 through a contact hole that passes through the interlayer insulating layer 107. Each of the driving source electrode S1 and the driving drain electrode D1 may be connected with the driving semiconductor layer A1 through a contact hole that passes through the interlayer insulating layer 107.

Meanwhile, the data line DL, the driving source electrode S1, the driving drain electrode D1, the switching source electrode S2, and the switching drain electrode D2 may be covered by an inorganic protective layer (not shown).

In an exemplary embodiment, the inorganic protective layer (not shown) may be a single layer or a multi-layer including $SiN_x$ and $SiO_x$. The inorganic protective layer (not shown) may prevent some wirings exposed in the non-display area NDA (e.g., wirings simultaneously formed during the same process as a manufacturing process of the data line DL) from being damaged by etchant used for patterning the pixel electrode 310.

The driving voltage line PL may be arranged on a layer different from a layer of the data line DL. In the present specification, "A and B are referred to as being arranged on different layers" means that at least one insulating layer is arranged between A and B, and one of A and B is arranged under the at least one insulating layer and the other of A and B is arranged on the at least one insulating layer. A first planarization layer 109 may be arranged between the driving voltage line PL and the data line DL, and the driving voltage line PL may be covered by a second planarization layer 111.

In an exemplary embodiment, the driving voltage line PL may be a single layer or a multi-layer including at least one of Al, Cu, Ti, and an alloy thereof. In an exemplary embodiment, the driving voltage line PL may include a three-layer structure of Ti/Al/Ti.

Though FIG. 3 shows a configuration in which the driving voltage line PL is arranged on the first planarization layer 109, the invention is not limited thereto. In another exemplary embodiment, the driving voltage line PL may be connected to an additional voltage line (not shown) disposed on the same layer as a layer of the data line DL through a through hole (not shown) defined in the second planarization layer 111 and may reduce a resistance.

The first planarization layer 109 and the second planarization layer 111 may include a single layer or a multi-layer.

The first planarization layer 109 and the second planarization layer 111 may include an organic insulating material. In an exemplary embodiment, for example, the organic insulating material may include an imide-based polymer, a general-purpose polymer such as polymethylmethacrylate ("PMMA") or polystyrene ("PS"), or polymer derivatives having a phenol-based group, an acryl-based polymer, an aryl ether-based polymer, an amide-based polymer, a fluorine-based polymer, a p-xylene-based polymer, and a vinyl alcohol-based polymer.

In an exemplary embodiment, the first planarization layer 109 and the second planarization layer 111 may include an inorganic insulating material. For example, the inorganic insulating material may include SiON, $SiO_x$, and $SiN_x$.

An organic light-emitting diode OLED including the pixel electrode 310, an opposite electrode 330, and an intermediate layer 320 therebetween may be located on the second planarization layer 111. The intermediate layer 320 may include an emission layer.

The pixel electrode 310 is connected with a connection wiring CL disposed on the first planarization layer 109, and the connection wiring CL is connected with the driving drain electrode D1 of the driving thin film transistor T1.

The pixel electrode 310 may include a transparent electrode or a reflective electrode.

In the case where the pixel electrode 310 includes a transparent electrode, the pixel electrode 310 may include a transparent conductive layer. In an exemplary embodiment, the transparent conductive layer may include at least one of indium tin oxide (ITO), zinc oxide (IZO), zinc oxide (ZnO), indium oxide ($In_2O_3$), indium gallium oxide (IGO), and aluminum zinc oxide (AZO). In this case, in addition to the transparent conductive layer, the pixel electrode 310 may further include a semi-transmissive layer configured to improve light efficiency. In an exemplary embodiment, the semi-transmissive layer may include a thin layer ranging from several nanometers (nm) to tens of nm and including at least one of Ag, Mg, Al, Pt, Pd, Au, Ni, Nd, Ir, Cr, Li, Ca, and Yb.

In the case where the pixel electrode 310 includes a reflective electrode, the pixel electrode 310 may include a reflective layer including at least one of Ag, Mg, Al, Pt, Pd, Au, Ni, Nd, Ir, Cr and a compound thereof, and a transparent conductive layer arranged on and/or under the reflective layer. In an exemplary embodiment, the transparent conductive layer may include at least one of ITO, IZO, ZnO, $In_2O_3$, IGO, and AZO.

The invention is not limited thereto, and the pixel electrode 310 may include various materials and have a single-layered or multi-layered structure. Various modifications may be made.

A pixel-defining layer 113 may be arranged on the pixel electrode 310.

The pixel-defining layer 113 defines a pixel by defining an opening that exposes the pixel electrode 310. Also, the pixel-defining layer 113 may prevent an arc from occurring at an end of the pixel electrode 310 by increasing a distance between an edge of the pixel electrode 310 and the opposite electrode 330. In an exemplary embodiment, the pixel-defining layer 113 may include an organic material such as polyimide or hexamethyldisiloxane ("HMDSO").

The intermediate layer 320 may include a low-molecular weight or polymer material.

In the case where the intermediate layer 320 includes a low-molecular weight material, the intermediate layer 320 may have a structure in which a hole injection layer ("HIL"), a hole transport layer ("HTL"), an emission layer ("EML"), an electron transport layer ("ETL"), an electron injection layer ("EIL"), etc. are stacked in a single or a composite configuration. In an exemplary embodiment, the intermediate layer 320 may include various organic materials such as copper phthalocyanine ("CuPc"), N,N'-Di(naphthalene-1-yl)-N,N'-diphenyl-benzidine ("NPB"), and tris-8-hydroxyquinoline aluminum ("Alq$_3$"). The intermediate layer 320 may be formed by various methods such as vacuum deposition.

In the case where the intermediate layer 320 includes a polymer material, the intermediate layer 320 may generally have a structure including an HTL and an EML. In this case, the HTL may include poly(3,4-ethylenedioxythiophene) ("PEDOT"), and the EML may include a polymer material such as polyphenylene vinylene ("PPV")-based material and a polyfluorene-based material. The intermediate layer 320 may be formed by various methods such as screen printing, inkjet printing, and laser induced thermal imaging.

The intermediate layer 320 may be provided as one body over a plurality of pixel electrodes 310 or provided as a patterned layer corresponding to each of the plurality of pixel electrodes 310.

The opposite electrode 330 is arranged above the display area DA and may cover the display area DA. That is, the opposite electrode 330 may be provided as one body over a plurality of organic light-emitting diodes OLED and may correspond to the plurality of pixel electrodes 310.

The opposite electrode 330 is electrically connected with the second power voltage line 20.

The opposite electrode 330 may include a transparent electrode or a reflective electrode.

In the case where the opposite electrode 330 includes a transparent electrode, the opposite electrode 330 may include at least one of Ag, Al, Mg, Li, Ca, Cu, LiF/Ca, LiF/Al, MgAg, and CaAg and may include a thin layer having a thickness ranging from several nm to tens of nm, for example.

In the case where the opposite electrode 330 includes a reflective electrode, the opposite electrode 330 may include at least one of Ag, Al, Mg, Li, Ca, Cu, LiF/Ca, LiF/Al, MgAg, and CaAg, for example. A configuration and a material of the opposite electrode 330 according to the invention are not limited thereto and may be modified variously.

Since the organic light-emitting diode OLED may be easily damaged by external moisture or oxygen, the organic light-emitting diode OLED may be protected by being covered by the thin-film encapsulation layer 400.

The thin-film encapsulation layer 400 may cover the display area DA and extend beyond the display area DA. The thin-film encapsulation layer 400 may include at least one organic encapsulation layer and at least one inorganic encapsulation layer. In an exemplary embodiment, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and include $SiO_x$, $SiN_x$, and/or SiON, in an exemplary embodiment.

When needed, other layers such as a capping layer (not shown) may be arranged between the first inorganic encapsulation layer 410 and the opposite electrode 330.

For example, the capping layer (not shown) may include at least one organic or inorganic material among $SiO_2$, SiNx, $ZnO_2$, $TiO_2$, $ZrO_2$, ITO, IZO, Alq$_3$, CuPc, CBP, a-NPB, and $ZiO_2$ so as to improve light efficiency. In another exemplary embodiment, the capping layer (not shown) may allow plasmon resonance to occur in response to light emitted from the organic light-emitting diode OLED. For example, the capping layer (not shown) may include nanoparticles.

Meanwhile, the capping layer (not shown) may prevent the organic light-emitting diode OLED from being damaged by heat, plasma, etc. generated during a chemical vapor deposition ("CVD") process or a sputtering process for forming the thin-film encapsulation layer 400. In an exemplary embodiment, for example, the capping layer (not shown) may include an epoxy-based material including at least one of a bisphenol-type epoxy resin, an epoxy-type butadiene resin, a fluorine-type epoxy resin, and a novolac epoxy resin.

Also, when needed, a layer (not shown) including LiF may be arranged between the first inorganic encapsulation layer 410 and the capping layer (not shown).

Since the first inorganic encapsulation layer 410 is disposed along a structure thereunder, a top surface of the first inorganic encapsulation layer 410 is not flat. The organic encapsulation layer 420 planarizes a top surface thereof by covering the first inorganic encapsulation layer 410. The top surface of the organic encapsulation layer 420 may be approximately flat at a portion of the top surface that corresponds to the display area DA.

In an exemplary embodiment, the organic encapsulation layer 420 may include at least one of polyethylene terephthalate (PET), polyethylene naphthalate (PEN), polycarbonate (PC), polyimide, polyethylene sulfonate, polyoxymethylene, polyarylate, HMDSO.

In an exemplary embodiment, the second inorganic encapsulation layer 430 may cover the organic encapsulation layer 420 and include $SiO_x$, $SiN_x$, and/or SiON. The second inorganic encapsulation layer 430 may allow the organic encapsulation layer 420 not to be exposed to the outside of the display device 1 (more specifically, the outside of the second dam unit 120) by that the second inorganic encapsulation layer 430 directly contacts the first inorganic encapsulation layer 410 in an edge region of the display device 1 (e.g., the second dam unit 120).

Referring to FIG. 4, in an area IVA-IVB, the buffer layer 101, the first gate insulating layer 103, and the second gate insulating layer 105 are arranged over the substrate 100, and a plurality of spider wirings SPL that extend from a driving circuit unit (not shown) to the terminal unit 30 (see FIG. 1) and that are spaced apart from each other is provided on the second gate insulating layer 105.

In an exemplary embodiment, the plurality of wirings SPL may include the same material as that of the second storage capacitor plate CE2 of the storage capacitor Cst.

The interlayer insulating layer 107 covers the plurality of spider wirings SPL, and the first power voltage line 10 and the second power voltage line 20 are arranged on the interlayer insulating layer 107.

The first power voltage line 10 has a structure in which the first conductive layer 10a and the second conductive layer 10b are stacked. The first conductive layer 10a is connected to the second conductive layer 10b through a contact hole defined by the first planarization layer 109 that extends from the display unit 1DA (see FIG. 1) and that is disposed between the first conductive layer 10a and the second conductive layer 10b.

A plurality of second conductive layers 10b is provided over the first conductive layer 10a, and a width W2 of the second conductive layer 10b is less than a width W1 of the first conductive layer 10a.

The first conductive layer 10a may include the same material as that of the data line DL or the driving source electrode S1 and the driving drain electrode D1 of the driving thin film transistor T1, or the switching source electrode S2 and the switching drain electrode D2 of the switching thin film transistor T2.

The second conductive layer 10b may include the same material as that of the driving voltage line PL or the connection wiring CL. In an exemplary embodiment, the second conductive layer 10b may have a stacked structure of Ti/Al/Ti.

The second power voltage line 20 may have a structure in which the third conductive layer 20a and the fourth conductive layer 20b are stacked. The third conductive layer 20a is connected to the fourth conductive layer 20b through a contact hole defined by the first planarization layer 109 that extends from the display unit 1DA (see FIG. 1) and that is disposed between the third conductive layer 20a and the fourth conductive layer 20b. A width of the fourth conductive layer 20b is greater than the width W2 of the second conductive layer 10b.

The third conductive layer 20a may include the same material as that of the first conductive layer 10a, and the fourth conductive layer 20b may include the same material as that of the second conductive layer 10b. In an exemplary embodiment, the fourth conductive layer 20b may have a stacked structure of Ti/Al/Ti.

A third dam unit 130 is arranged at a location where the first conductive layer 10a overlaps the second conductive layer 10b in the plan view. The third dam unit 130 may include a first layer 111c including the same material as that of the second planarization layer 111, and a second layer 113c including the same material as that of the pixel-defining layer 113.

The first layer 111c of the third dam unit 130 clads all of a top surface and lateral surfaces of the second conductive layer 10b to prevent the second conductive layer 10b from contacting the opposite electrode 330.

The second layer 113c of the third dam unit 130 is provided to clad a top surface and lateral surfaces of the first layer 111c. While the second layer 113c is patterned during a photolithography process, a process margin is secured and a height of the second layer 113c is stably secured and the second conductive layer 10b may be prevented from contacting the opposite electrode 330.

Though FIG. 4 shows the structure in which the third dam unit 130 includes both the first layer 111c and the second layer 113c, the invention is not limited thereto. The third dam unit 130 may include one of the first layer 111c and the second layer 113c. In this case, the selected one layer may be provided higher, during a patterning process that uses a half-tone mask, than a height of the second planarization layer 111 disposed in the display area DA.

The opposite electrode 330 that extends from the display unit 1DA (see FIG. 1) covers a portion of the second layer 113c of the third dam unit 130. In a case that an area covered by the opposite electrode 330 is large, it is advantageous in preventing deterioration of the organic light-emitting diode OLED.

The first dam unit 110 and the second dam unit 120 spaced apart from each other are spaced apart from the third dam unit 130 in a direction facing an end of the substrate 100. At least a portion of the first dam unit 110 and the second dam unit 120 is arranged at a location where the third conductive layer 20a overlaps the fourth conductive layer 20b in the plan view.

The first dam unit 110 may include a first layer 111a including the same material as that of the second planarization layer 111, and a second layer 113a including the same material as that of the pixel-defining layer 113.

Though FIG. 4 shows that the first layer 111a of the first dam unit 110 clads both a top surface and lateral surfaces of the fourth conductive layer 20b, the invention is not limited thereto. The first layer 111c of the third dam unit 130 may cover an end of the second conductive layer 10b to prevent deterioration of the second conductive layer 10b.

The second dam unit 120 may include a first layer 111b including the same material as that of the second planarization layer 111, a second layer 113b including the same material as that of the pixel-defining layer 113, and a third layer 115b including the same material as that of a spacer (not shown).

The spacer (not shown) may protrude from the pixel-defining layer 113 in a direction of the thin-film encapsulation layer 400 and be configured to prevent a defect due to a mask chopping, etc. during a manufacturing process. The spacer (not shown) may include the same material as that of the pixel-defining layer 113 and may be provided to have a height different from that of the pixel-defining layer 113 when forming the pixel-defining layer 113 by using a half-tone mask.

The organic encapsulation layer 420 may be prevented from flowing out over the second dam unit 120, and a mask chopping may be prevented by providing the second dam unit 120 higher than the first dam unit 110.

The first dam unit 110 and the second dam unit 120 serve as dams that block flowing of the organic material into an edge of the substrate 100 when forming the organic encapsulation layer 420 including the organic material and constituting the thin-film encapsulation layer 400. Therefore, the first dam unit 110 and the second dam unit 120 may prevent an edge tail of the organic encapsulation layer 420 from being formed at the edge of the substrate 100.

However, a case where the organic encapsulation layer 420 flows to the edge of the substrate 100 beyond the first dam unit 110 and the second dam unit 120 despite the arrangement of the first dam unit 110 and the second dam unit 120 may occur. For example, in the case where the second dam unit 120 is arranged closer to the first dam unit 110 from the edge of the substrate 100 so as to reduce an area recognized as a dead space (i.e., area which does not implement an image) from a viewer of the outside, or the first dam unit 110 is arranged closer to the second dam unit 120 so as to increase the display unit 1DA, an interval between the first dam unit 110 and the second dam unit 120 may be reduced and thus the organic encapsulation layer 420 may flow beyond the second dam unit 120 to the edge of the substrate 100.

In the present exemplary embodiment, since the third dam unit 130 is arranged between the display unit 1DA and the first dam unit 110 such that the third dam unit 130 overlaps the first power voltage line 10 in the plan view, a reflow velocity of the organic material may be reduced. Therefore, the edge tail of the organic material may be effectively prevented.

Meanwhile, to reduce an area of the dead space, an alternative of reducing widths of the first power voltage line 10 and the second power voltage line 20 may be provided. However, if the widths of the first power voltage line 10 and the second power voltage line 20 are reduced, resistance values of the first power voltage line 10 and the second power voltage line 20 may increase.

In the present exemplary embodiment, since the first power voltage line 10 has a two-story layer in which the first conductive layer 10*a* and the second conductive layer 10*b* are stacked, and the second power voltage line 20 has a two-story layer in which the third conductive layer 20*a* and the fourth conductive layer 20*b* are stacked, the resistance values thereof may be reduced, a voltage drop inside the first power voltage line 10 or the second power voltage line 20 is effectively prevented, and thus a high-quality image may be provided.

Figure 5:
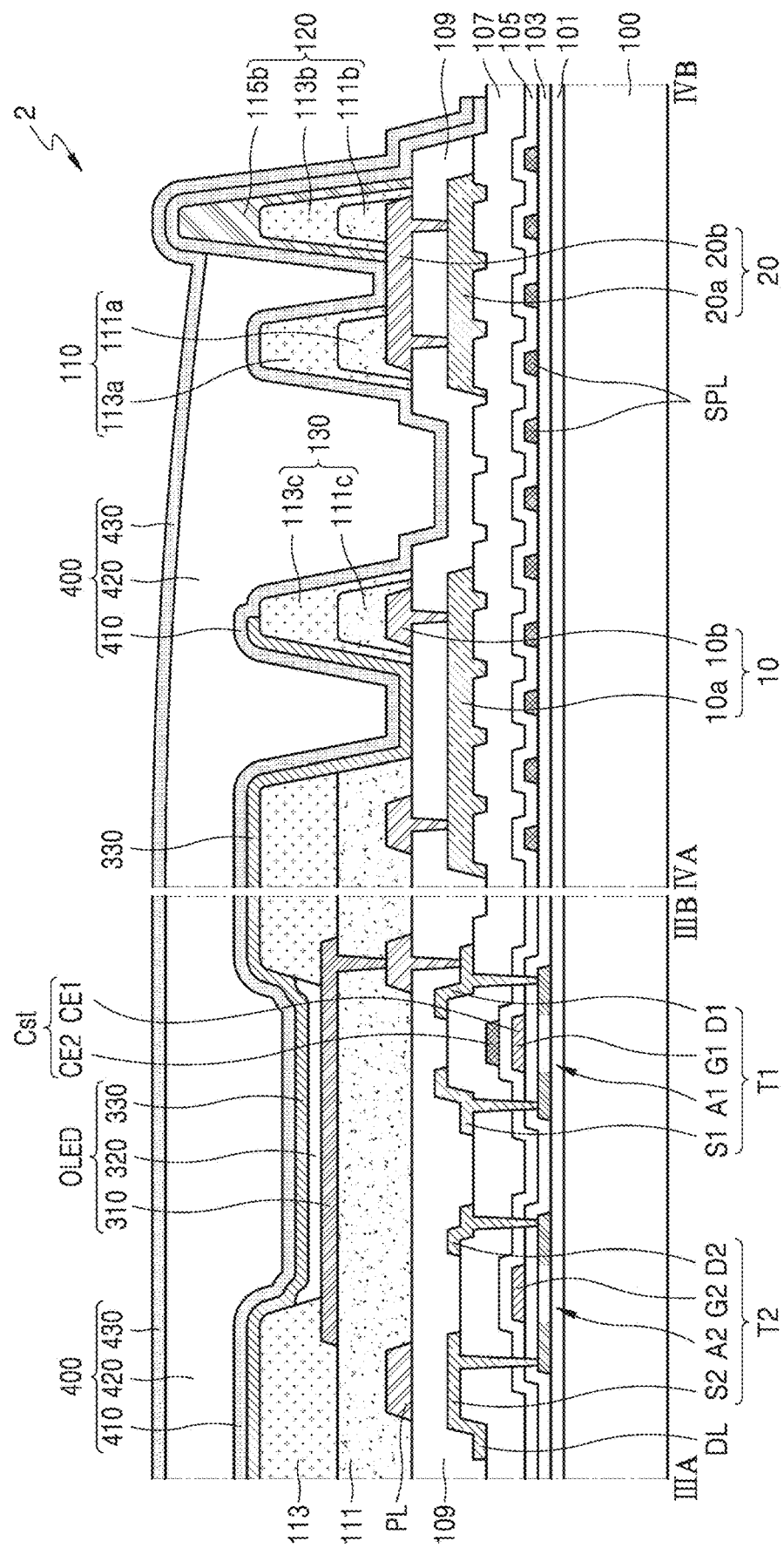
FIG. 5 is a cross-sectional view of a display device according to another exemplary embodiment.

FIG. 5 is a cross-sectional view of a display device 2 according to another exemplary embodiment. In FIG. 5, since same reference numerals as those of FIG. 4 represent same members, repeated descriptions thereof are omitted and differences are mainly described.

Referring to FIG. 5, the buffer layer 101 and the first gate insulating layer 103 are arranged on the substrate 100. A plurality of wirings SPL that extend from a driving circuit unit (not shown) toward the terminal unit 30 (see FIG. 1) and that are spaced apart from each other is arranged on the first gate insulating layer 103.

The plurality of wirings SPL is covered by the second gate insulating layer 105 and the interlayer insulating layer 107, and the first power voltage line 10 and the second power voltage line 20 are arranged on the interlayer insulating layer 107.

The present exemplary embodiment is different from the above exemplary embodiment in that the plurality of wiring SPL is arranged on the first gate insulating layer 103 instead of the second gate insulating layer 105.

The driving circuit unit (not shown) may include a gate driving circuit unit configured to transfer a driving gate signal to a pixel, and a data driving circuit unit configured to transfer a data signal to a pixel. The driving circuit unit (not shown) may be arranged between the display unit 1DA (see FIG. 1) and the first dam unit 110. A wiring that extends from the driving circuit unit (not shown) may be connected with the terminal unit 30 through the wiring SPL.

In the present exemplary embodiment, the wiring SPL may include the same material as that of the first storage capacitor plate CE1 of the storage capacitor Cst which serves as the driving gate electrode G1 of the driving thin film transistor T1, or the switching gate electrode G2 of the switching thin film transistor T2.

Compared to the above exemplary embodiment shown in FIG. 4, in the present exemplary embodiment, by adding the second gate insulating layer 105 to the insulating spaces between the wirings SPL and the first conductive layer 10*a* of the first power voltage line 10 and between the wirings SPL and the third conductive layer 20*a* of the second power voltage line 20, mutual interference of electric signals between the conductive layers may be reduced. In an exemplary embodiment, the wirings SPL may be disposed in a direction that crosses the first conductive layer 10*a* and the third conductive layer 20*a*.

Figure 6:
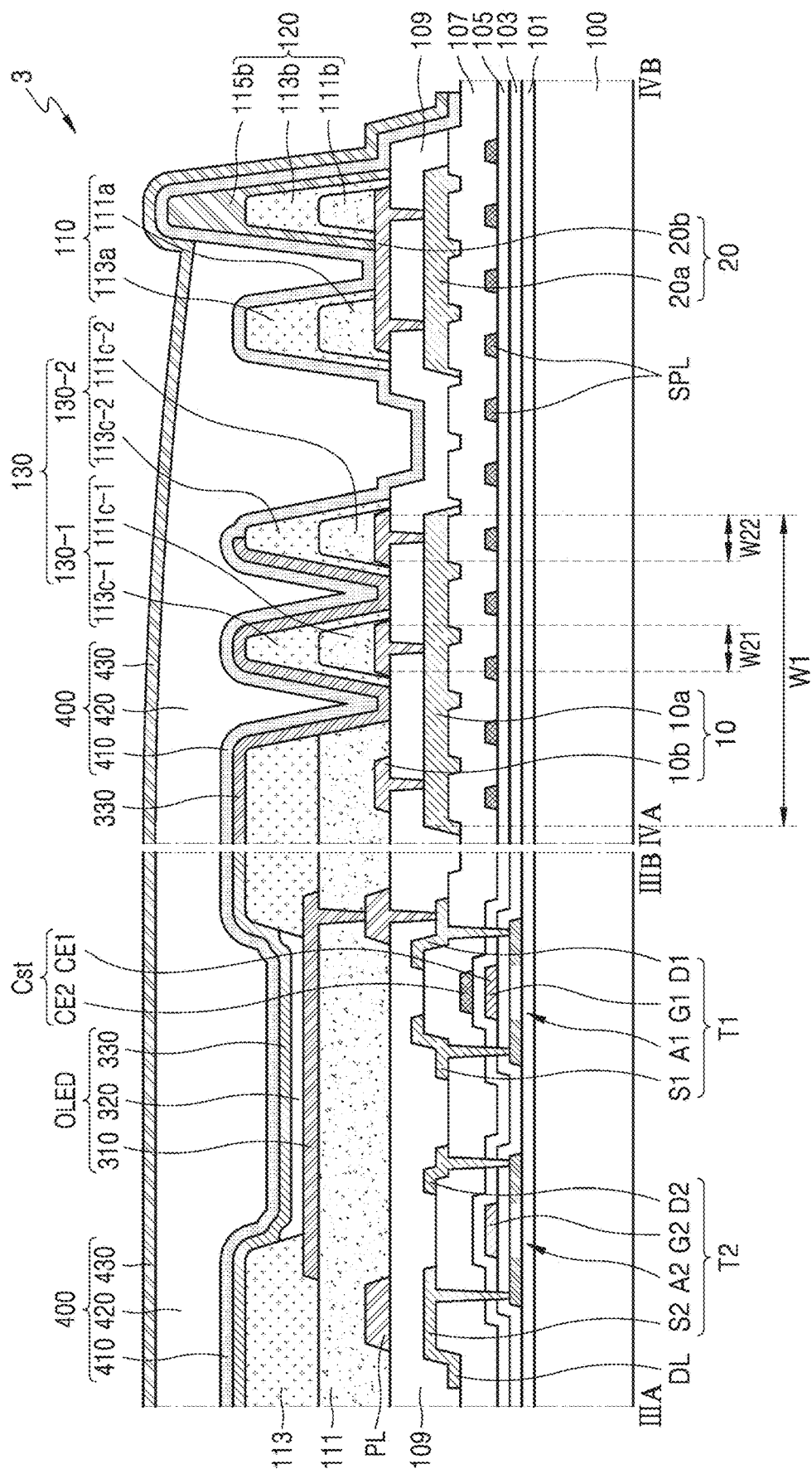
FIG. 6 is a cross-sectional view of a display device according to still another exemplary embodiment.

FIG. 6 is a cross-sectional view of a display device 3 according to still another exemplary embodiment. In FIG. 6, since same reference numerals as those of FIG. 4 represent same members, repeated descriptions thereof are omitted and differences are mainly described.

Referring to FIG. 6, the buffer layer 101, the first gate insulating layer 103 and the second gate insulating layer 105 are arranged on the substrate 100. A plurality of wirings SPL that extend from a driving circuit unit (not shown) toward the terminal unit 30 (see FIG. 1) and that are spaced apart from each other is arranged on the second gate insulating layer 105.

The plurality of wirings SPL is covered by the interlayer insulating layer 107, and the first power voltage line 10 and the second power voltage line 20 are arranged on the interlayer insulating layer 107.

The first power voltage line 10 has a structure in which the first conductive layer 10*a* and the second conductive layer 10*b* are stacked. Though a configuration in which a plurality of second conductive layers 10*b* is provided over the first conductive layer 10*a* is the same as the above exemplary embodiment shown in FIG. 4, the present exemplary embodiment is different from the above exemplary embodiment in the number of second conductive layers 10*b* arranged in an area serving as the third dam unit 130. One second conductive layer 10*b* is arranged in the area serving as the third dam unit 130 in the above exemplary embodiment shown in FIG. 4. In contrast, two second conductive layers 10*b* are arranged in the present exemplary embodiment. That is, in the present exemplary embodiment, the third dam unit 130 includes a first sub-dam unit 130-1 and a second sub-dam unit 130-2.

Widths W21 and W22 of the second conductive layers 10*b* are less than a width W1 of the first conductive layer 10*a*, respectively.

A first layer 111*c*-1 of the first sub-dam unit 130-1 may prevent the second conductive layer 10*b* from contacting the opposite electrode 330 by cladding all of a top surface and lateral surfaces of the second conductive layer 10*b*.

A second layer 113*c*-1 of the first sub-dam unit 130-1 is provided to clad a top surface and lateral surfaces of the first layer 111*c*-1. While the second layer 113*c*-1 is patterned during a photolithography process, a process margin is secured and a height of the second layer 113*c*-1 is stably secured so that the second conductive layer 10*b* may be effectively prevented from contacting the opposite electrode 330.

A first layer 111*c*-2 of the second sub-dam unit 130-2 may prevent the second conductive layer 10*b* from contacting the opposite electrode 330 by cladding all of a top surface and lateral surfaces of the second conductive layer 10*b*.

The second layer 113*c*-2 of the second sub-dam unit 130-2 is provided to clad a top surface and lateral surfaces of the first layer 111*c*-2. While the second layer 113*c*-2 is patterned during a photolithography process, a process margin is secured and a height of the second layer 113*c*-2 is stably secured so that the second conductive layer 10*b* may be effectively prevented from contacting the opposite electrode 330.

The present exemplary embodiment may prevent an area of the dead space from increasing by dividing the second conductive layer 10*b* and configuring the third dam unit 130 with a plurality of sub-dam units, and thus even more reducing a reflow velocity of the organic material.

Though FIG. 6 shows two sub-dam units that constitute the third dam unit 130 are provided, the invention is not limited thereto and the third dam unit 130 may include three or more sub-dam units, in another exemplary embodiment.

Figure 7:
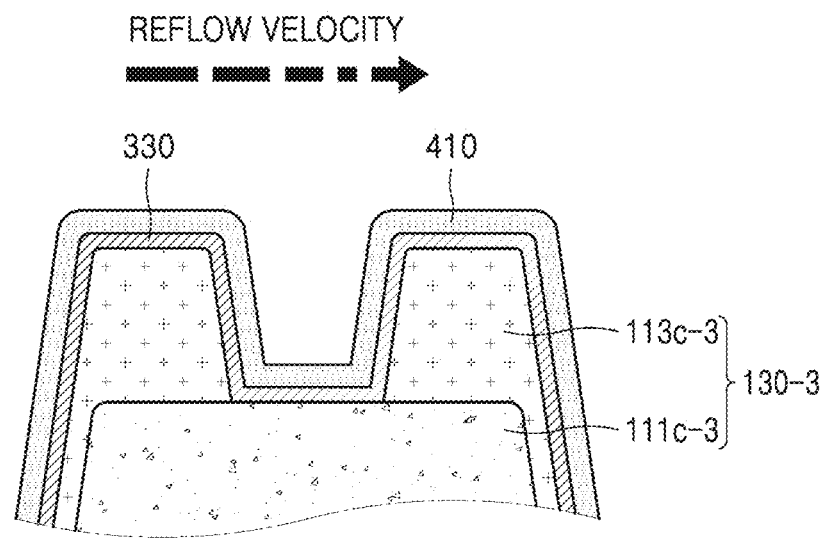
FIGS. 7 and 8 are cross-sectional views of an exemplary embodiment in which a step difference is provided in a top surface of a third dam unit.
Figure 8:
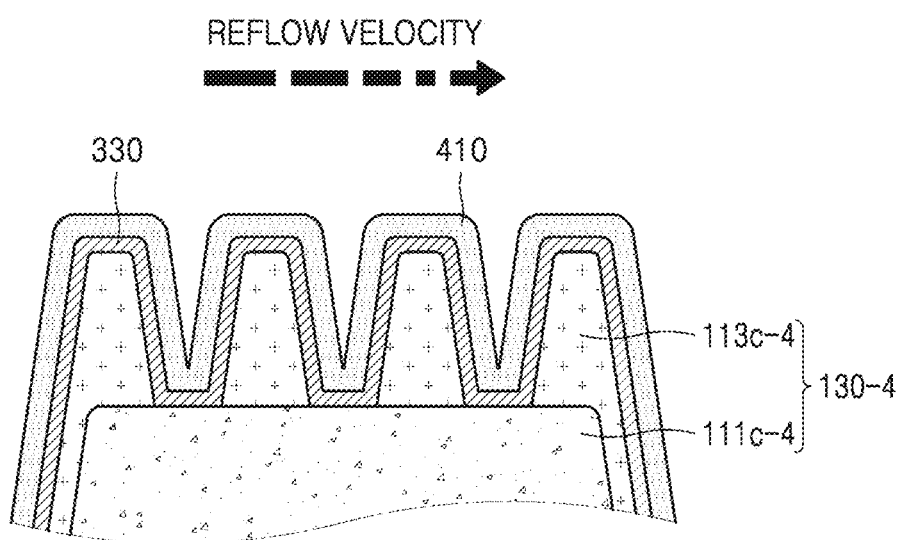

FIGS. 7 and 8 are cross-sectional views of exemplary embodiments in which step differences are provided in a top surface of the third dam unit.

Referring to FIG. 7, step differences are provided in a second layer 113*c*-3 arranged on a first layer 111*c*-3 of a third sub-dam unit 130-3, and thus the second layer 113*c*-3 is divided into two parts.

The first layer 111*c*-3 may include the same material as that of the second planarization layer 111 (see FIGS. 4, 5, and 6) as described above, and though not shown in FIG. 7, the first layer 111*c*-3 clads a top surface and lateral surfaces of the second conductive layer 10b (see FIGS. 4, 5, and 6) of the first power voltage line 10 (see FIGS. 4, 5, and 6).

As described above, the second layer 113c-3 includes the same material as that of the pixel-defining layer 113 (see FIGS. 4, 5, and 6), and the second layer 113c-3 is divided into two parts by providing the second layers 113c-3 on one first layer 111c-3 such that the second layers 113c-3 have a step difference. The step difference may be provided by using, for example, a photolithography process.

Though FIG. 7 shows the case where the step differences of the second layer 113c-3 divided into two parts are the same, the invention is not limited thereto. Shapes of the step differences may be variously changed.

Also, though FIG. 7 shows a structure in which step differences are provided such that a portion of a top surface of the first layer 111c-3 is exposed, the invention is not limited thereto. In another exemplary embodiment, the step difference may be provided such that the top surface of the first layer 111c-3 is not exposed and a portion of the second layer 113c-3 remains on the top surface of the first layer 111c-3.

The opposite electrode 330 covers a portion of the second layer 113c-3, and the first inorganic encapsulation layer 410 is arranged on the opposite electrode 330.

Like the above exemplary embodiments, the first inorganic encapsulation layer 410 may entirely cover the third sub-dam unit 130-3 and extend to an end of the second dam unit 120 (see FIGS. 4, 5, and 6).

When forming the organic encapsulation layer 420 including the organic material (see FIGS. 4, 5, and 6) after forming the first inorganic encapsulation layer 410, a reflow velocity of the organic material may be reduced due to the step differences provided in the second layer 113c-3. Therefore, an edge tail of the organic material may be effectively prevented from forming. Therefore, an area of the dead space may be effectively prevented from increasing.

Referring to FIG. 8, step differences are provided in a second layer 113c-4 arranged on a first layer 111c-4 of a fourth sub-dam unit 130-4, and thus the second layer 113c-4 is divided into four parts.

Compared to FIG. 7, the exemplary embodiment of FIG. 8 is different from FIG. 7 in the number of divided parts of the second layer 113c-4, and the rest of the structure is the same.

A reflow velocity of the organic material may be even more reduced by forming a greater number of step differences in the second layer 113c-4. Therefore, an edge tail of the organic material may be effectively prevented. Therefore, an area of the dead space may be prevented from increasing.

Even though FIGS. 7 and 8 show the exemplary embodiment in which the step differences are provided in the third dam units 130-3 and 130-4, the present exemplary embodiment may be applicable to the first dam unit 110 (see FIGS. 4, 5, and 6) and the second dam unit 120 (see FIGS. 4, 5, and 6). For example, a reflow velocity of the organic material may be even more reduced by also providing step differences in the second layer 113a (see FIGS. 4, 5, and 6), which is a top layer of the first dam unit 110 (see FIGS. 4, 5, and 6), and in the third layer 115b (see FIGS. 4, 5, and 6), which is a top layer of the second dam unit 120 (see FIGS. 4, 5, and 6), in another exemplary embodiment.

According to exemplary embodiments, the dead space may be reduced by arranging the third dam unit between the display unit and the first dam unit such that the third dam unit overlaps the first power voltage line and thus reducing a reflow velocity of an organic material. Also, a display device that provides a high-quality image through a power voltage line where voltage drop is reduced may be implemented. However, the scope of the invention is not limited by this effect.

Although the disclosure has been described with reference to the exemplary embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A display device comprising:
a substrate;
a display area located over the substrate and which includes a plurality of pixels;
a non-display area arranged outside the display area;
a first power voltage line which corresponds to one side of the display area in the non-display area and includes a first conductive layer and a second conductive layer arranged over the first conductive layer;
a second power voltage line spaced apart from the first power voltage line in the non-display area;
a first dam unit which surrounds the display area and overlaps the second power voltage line in a plan view;
a second dam unit arranged outside the first dam unit; and
a third dam unit arranged between the display area and the first dam unit and which overlaps the first conductive layer and the second conductive layer of the first power voltage line in the plan view.

2. The display device of claim 1, further comprising:
a first planarization layer arranged in the display area and the non-display area;
a second planarization layer arranged over the first planarization layer; and
a pixel-defining layer arranged over the second planarization layer,
wherein the third dam unit includes at least one of the pixel-defining layer and the second planarization layer.

3. The display device of claim 2, wherein a step difference is provided in a top surface of an upper layer among the pixel-defining layer and the second planarization layer.

4. The display device of claim 2, wherein a bottom layer among the pixel-defining layer and the second planarization layer clads an end of the second conductive layer.

5. The display device of claim 4, wherein an upper layer among the pixel-defining layer and the second planarization layer clads an end of the bottom layer.

6. The display device of claim 1, wherein each of the pixels includes a first electrode, an emission layer arranged on the first electrode, and a second electrode arranged on the emission layer, and
the second electrode is arranged in common in the plurality of pixels and extends to the non-display area to cover a portion of the third dam unit.

7. The display device of claim 1, further comprising a thin-film encapsulation layer which includes a first inorganic encapsulation layer that covers the display area, an organic encapsulation layer on the first inorganic encapsulation layer, and a second inorganic encapsulation layer on the organic encapsulation layer,
wherein the thin-film encapsulation layer covers the third dam unit.

8. The display device of claim 7, wherein the first inorganic encapsulation layer directly contacts the second inorganic encapsulation layer at the outside of the second dam unit.

9. The display device of claim 1, wherein a width of the second conductive layer is less than a width of the first conductive layer.

10. The display device of claim 9, wherein the second conductive layer is provided in plural and the second conductive layers are spaced apart from each other over the first conductive layer, and
the third dam unit clads, with an insulating layer, each of the plurality of second conductive layers spaced apart from each other to constitute a plurality of sub-dam units.

11. The display device of claim 1, wherein an insulating layer is arranged between the first conductive layer and the second conductive layer, and
the first conductive layer is electrically connected with the second conductive layer through a contact hole defined by the insulating layer.

12. The display device of claim 1, wherein the second power voltage line includes a third conductive layer and a fourth conductive layer arranged on the third conductive layer.

13. The display device of claim 12, wherein an insulating layer is arranged between the third conductive layer and the fourth conductive layer, and
the third conductive layer is electrically connected with the fourth conductive layer through a contact hole defined by the insulating layer.

14. The display device of claim 12, wherein the first dam unit or the second dam unit clads an end of the fourth conductive layer.

15. The display device of claim 12, wherein the third conductive layer includes a same material as the first conductive layer, and the fourth conductive layer includes a same material as the second conductive layer.

16. The display device of claim 12, wherein a width of the fourth conductive layer is greater than a width of the second conductive layer.

17. The display device of claim 12, wherein a plurality of wirings spaced apart from each other is disposed between the substrate and the first conductive layer and between the substrate and the third conductive layer in a direction that crosses the first conductive layer and the third conductive layer.

18. The display device of claim 1, further comprising:
a first planarization layer arranged in the display area and the non-display area;
a second planarization layer arranged over the first planarization layer; and
a pixel-defining layer arranged over the second planarization layer,
wherein the first dam unit and the second dam unit include at least one of the pixel-defining layer and the second planarization layer.

19. The display device of claim 1, wherein a height of the second dam unit is greater than a height of the first dam unit.

20. A display device comprising:
a display area including a plurality of display elements;
a non-display area arranged outside the display area;
a terminal unit arranged at an end of the non-display area;
a first power voltage line arranged between the display area and the terminal unit and which includes a first conductive layer and a second conductive layer arranged on the first conductive layer;
a second power voltage line spaced apart from the first power voltage line and which includes a third conductive layer and a fourth conductive layer arranged on the third conductive layer;
a first dam unit which overlaps the second power voltage line in a plan view;
a second dam unit arranged outside the first dam unit;
a third dam unit arranged between the display area and the first dam unit and which overlaps the first conductive layer and the second conductive layer of the first power voltage line in the plan view; and
a thin-film encapsulation layer which includes a first inorganic encapsulation layer covering the display area and the third dam unit, an organic encapsulation layer on the first inorganic encapsulation layer, and a second inorganic encapsulation layer on the organic encapsulation layer.

21. The display device of claim 20, further comprising:
a first planarization layer arranged in the display area and the non-display area;
a second planarization layer arranged over the first planarization layer; and
a pixel-defining layer arranged over the second planarization layer,
wherein the third dam unit includes at least one of the pixel-defining layer and the second planarization layer.

22. The display device of claim 20, wherein a plurality of wirings spaced apart from each other is disposed between the substrate and the first conductive layer and between the substrate and the third conductive layer in a direction that faces the terminal unit.

23. The display device of claim 20, wherein the third conductive layer includes a same material as the first conductive layer, and the fourth conductive layer includes a same material as the second conductive layer.

24. The display device of claim 20, further comprising a thin film transistor,
wherein the first to third dam units include an insulating layer pattern including a same material as an insulating layer arranged between the thin film transistor and the display element.

* * * * *